United States Patent
Spiers et al.

(10) Patent No.: US 8,086,359 B2
(45) Date of Patent: Dec. 27, 2011

(54) DYNAMIC THERMAL LOAD BALANCING

(75) Inventors: Adam Z. Spiers, London (GB); Till Franke, Friedrichsdorf (DE)

(73) Assignee: Novell, Inc., Provo, UT (US)

( * ) Notice: Subject to any disclaimer, the term of this patent is extended or adjusted under 35 U.S.C. 154(b) by 411 days.

(21) Appl. No.: 12/390,878

(22) Filed: Feb. 23, 2009

(65) Prior Publication Data
US 2010/0217454 A1   Aug. 26, 2010

(51) Int. Cl.
| G05D 23/00 | (2006.01) |
| G01K 1/08 | (2006.01) |
| G01K 17/00 | (2006.01) |
| G06F 1/16 | (2006.01) |
| H05K 5/00 | (2006.01) |
| H05K 7/00 | (2006.01) |

(52) U.S. Cl. ... 700/300; 702/132; 702/136; 361/679.02; 361/724

(58) Field of Classification Search ................... 700/299, 700/300; 702/130, 132, 136; 713/300, 320; 718/1; 361/679.01, 679.02, 679.46, 688, 361/724
See application file for complete search history.

(56) References Cited

U.S. PATENT DOCUMENTS

| 6,934,864 B2 | 8/2005 | Chu et al. |
| 6,948,082 B2 | 9/2005 | Gschwind et al. |
| 6,964,539 B2 | 11/2005 | Bradley et al. |
| 7,127,625 B2 * | 10/2006 | Farkas et al. ................ 713/320 |
| 7,421,368 B2 * | 9/2008 | Dalton et al. ................ 702/130 |
| 7,447,920 B2 | 11/2008 | Sharma et al. |
| 2005/0228618 A1 | 10/2005 | Patel et al. |
| 2006/0161307 A1 | 7/2006 | Patel et al. |
| 2006/0206291 A1 | 9/2006 | Bash et al. |
| 2007/0100494 A1 | 5/2007 | Patel et al. |
| 2009/0037162 A1 * | 2/2009 | Gaither et al. .................. 703/18 |
| 2009/0265568 A1 * | 10/2009 | Jackson ........................ 713/320 |
| 2010/0037073 A1 * | 2/2010 | Huizenga et al. ............. 713/320 |
| 2011/0107332 A1 * | 5/2011 | Bash ................................ 718/1 |

OTHER PUBLICATIONS

Ratnesh K. Sharma, Cullen E. Bash, Chandrakant D. Patel, Richard J. Friedrich, Jeffrey S. Chase, "Balance of Power: Dynamic Thermal Management for Internet Data Centers," IEEE Internet Computing, vol. 9, No. 1, pp. 42-49, Jan./Feb. 2005.
"Novell ZENworks Orchestrator" http://www.novell.com/products/zenworks/orchestrator/data_center.html, © 2009 Novell, Inc.

* cited by examiner

*Primary Examiner* — Crystal J Barnes-Bullock
(74) *Attorney, Agent, or Firm* — King & Schickli, PLLC

(57) ABSTRACT

A method for improving thermal efficiency in one or more data centers includes measuring a temperature at one or more computing devices having allocated thereto one or more computing workloads and determining whether the measured temperature exceeds a predetermined temperature threshold. If the predetermined temperature threshold is exceeded, sufficient computing workloads are migrated to one or more alternate computing devices to reduce the temperature at one or more of the computing devices to less than or equal to said predetermined temperature threshold. In accomplishing the method, there is provided a data orchestrator configured at least for receiving data concerning the measured temperature, determining whether the measured temperature exceeds the predetermined temperature threshold, and migrating one or more of the computing workloads to one or more alternate computing devices. Computer systems and computer programs available as a download or on a computer-readable medium for installation according to the invention are provided.

15 Claims, 8 Drawing Sheets

DYNAMIC THERMAL LOAD BALANCING

FIELD OF THE INVENTION

Generally, the present invention relates to methods and systems for thermal management in data centers. Particularly, it relates to computing methods and systems, and software incorporating the methods and systems, for thermal management in data centers by live migration of computing workloads from areas of excessive heat in the data center to areas of lesser heat, thereby reducing thermal stress.

BACKGROUND OF THE INVENTION

Particularly in the case of Internet-based applications, it is common to house servers hosting such applications in data centers. Because of the centralization of these computing resources in data centers, which may house hundreds of computing devices such as servers in a relatively small physical space, heat management and thermal efficiency of such data centers has become a significant issue. Indeed, it is estimated that the power needed to dissipate heat generated by components of a typical data center is equal to approximately 50% of the power needed to actually operate those components (see U.S. Published Patent Appl. No. 2005/0228618, at paragraph 0002).

Further, even in discrete areas of a data center, localized areas of thermal stress, or "hot spots," may occur. This is because in a typical data center configuration, computing devices such as servers are typically housed in racks of known design. Because of considerations such as distance from cooling units and/or air movement devices, particular areas of a data center may be significantly hotter than others. For example, the temperature at a top of a rack may be significantly higher than the temperature at the bottom of the same rack, due to the rising of heated air and potentially a distance of the top of the rack from a source of cooling or air movement compared to the bottom of the same rack. Even more, a rack which houses a number of servers which are powered on and hosting computing workloads will likely generate more heat than a corresponding rack in the same area of the data center with fewer servers, or which is hosting fewer computing workloads.

Traditionally, to address this issue of thermal stress or "hot spots," hardware-based methods have been utilized i.e., increasing cooling parameters in the data center, powering down computing resources located in areas of thermal stress, and the like. Alternatively, it is known to pre-allocate computing resources according to a variety of parameters including computing capacity and temperature considerations (for example, see U.S. Published Patent Application No. 2005/0228618). Thus, while it is known to address thermal stress in data centers proactively, conventional reactive means (that is, detecting and addressing existing or newly created thermal stress in a data center) are typically limited to hardware solutions.

However, a variety of situations may arise where more efficient and economical reactive means for addressing newly created thermal stress in a data center are desirable, particularly in the case where computing resources have been provisioned and the thermal stress does not occur or is not detected until well after such provisioning. For example, human or even computer error may result in over-provisioning workloads to particular servers located in a common area of a data center, resulting in a "hot spot." Alternatively, a cooling unit in a particular area of a data center may fail or be functioning at a reduced efficiency, resulting in a "hot spot."

There accordingly remains a need in the art for methods for addressing such thermal stress issues, to allow real- or near-real time improvements in thermal efficiency of the data center without need for altering cooling capacity or powering down computing resources. In particular, improved reactive methods for addressing existing or newly created thermal stress are desirable. Any improvements along such lines should further contemplate good engineering practices, such as relative inexpensiveness, stability, ease of implementation, low complexity, security, unobtrusiveness, etc.

SUMMARY OF THE INVENTION

The above-mentioned and other problems become solved by applying the principles and teachings associated with the hereinafter-described methods and systems for improving thermal efficiency in one or more data centers. The invention is suited for optimization of thermal efficiency in single data centers, or in a plurality of data centers forming a grid of resources. Broadly, the invention provides improvement in thermal efficiency of one or more data centers by migrating computing resources, defined as virtual machines, away from areas of thermal stress in a data center.

Generally, there is described a method for improving thermal efficiency in one or more data centers housing a plurality of computing devices. In one aspect, the method includes determining a temperature at one or more of the plurality of computing devices having allocated thereto one or more computing workloads, determining whether that measured temperature exceeds a predetermined temperature threshold, and if so, migrating a sufficient number of the one or more computing workloads to one or more alternate computing devices to reduce the temperature at one or more of the plurality of computing devices to less than or equal to said predetermined temperature threshold. In accomplishing the method, a data orchestrator is provided configured at least for receiving data concerning the measured temperature, determining whether the measured temperature exceeds the predetermined temperature threshold, and migrating the one or more computing workloads. The computing workloads are typically configured as virtual machines.

In one embodiment, the data orchestrator calculates the predetermined temperature threshold by receiving temperature data from at least one temperature sensor for measuring a maximum temperature and a minimum temperature at the one or more data centers, calculating a ratio between the measured maximum and minimum temperatures, and determining whether that calculated temperature ratio falls within a predetermined range of temperature ratios. If so, the data orchestrator determines whether the measured temperature at the one or more of the plurality of computing devices having allocated thereto one or more computing workloads exceeds a predetermined temperature maximum. In this manner, unnecessary migration of computing workloads is prevented. In a particular embodiment, the data orchestrator is configured (comprises a policy or policies) to migrate sufficient of the one or more computing workloads to one or more alternate computing devices according to at least one of a measured temperature at the one or more alternate computing devices and a capacity of the one or more alternate computing devices to perform the computing workload migrated thereto.

In another aspect, a method is provided for improving thermal efficiency in one or more data centers housing a plurality of computing devices in a computing system environment. The method comprises providing a plurality of computing devices hosting a pool of computing workloads defined by virtual machines, providing a plurality of sensors for measuring a temperature at one or more of the plurality of computing devices, and providing a data orchestrator configured at least for receiving data concerning a measured temperature at one or more of the plurality of computing devices. Further, the data orchestrator determines whether the measured temperature exceeds a predetermined temperature threshold, and if so migrates sufficient of the one or more computing workloads to one or more alternative computing devices to reduce said measured temperature to less than or equal to said predetermined temperature threshold. The computing devices may comprise one or more servers housed in the one or more data centers. Calculation of the predetermined temperature threshold, and the policy or policies defining when the data orchestrator will migrate virtual machines and where, may be as described above.

In yet another aspect, there is provided a computing system for improving thermal efficiency in one or more data centers housing a plurality of computing devices. The computing system comprises a plurality of servers hosting a pool of computing workloads defined by virtual machines, a plurality of sensors for measuring a temperature at one or more of the plurality of computing devices, and a data orchestrator as described above. As set forth above, the data orchestrator is configured at least for receiving data concerning a measured temperature at one or more of the plurality of servers, for determining whether the measured temperature exceeds a predetermined temperature threshold. If so, the data orchestrator migrates sufficient of the one or more computing workloads to one or more alternative servers to reduce the measured temperature to less than or equal to said predetermined temperature threshold.

In still yet another aspect, there is provided a computer program product available as a download or on a computer-readable medium for installation with a computing device of a user, comprising a database component for storing a predetermined temperature threshold for a plurality of servers, a predetermined temperature ratio range for one or more data centers housing the plurality of servers, and a predetermined temperature maximum for the plurality of servers. The computer program product comprises also a data orchestrator component, which may be integral with the database component, for migrating sufficient of a plurality of computing workloads to one or more alternate servers to reduce said temperature at one or more of the plurality of servers to less than or equal to the predetermined temperature threshold. The data orchestrator component may define a computing workload migrating policy for migrating one or more of said plurality of computing workloads, which policy may be defined as described above. Typically, the computing workloads are defined as virtual machines.

These and other embodiments, aspects, advantages, and features of the present invention will be set forth in the description which follows, and in part will become apparent to those of ordinary skill in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The accompanying drawings incorporated in and forming a part of the specification, illustrate several aspects of the present invention, and together with the description serve to explain the principles of the invention. In the drawings:

FIG. 4 shows a thermal profile for the data center as depicted in FIG. 3, wherein the servers have been powered on.

DETAILED DESCRIPTION OF THE ILLUSTRATED EMBODIMENTS

In the following detailed description of the illustrated embodiments, reference is made to the accompanying drawings that form a part hereof, and in which is shown by way of illustration, specific embodiments in which the invention may be practiced. These embodiments are described in sufficient detail to enable those skilled in the art to practice the invention and like numerals represent like details in the various figures. Also, it is to be understood that other embodiments may be utilized and that process, mechanical, electrical, arrangement, software and/or other changes may be made without departing from the scope of the present invention. In accordance with the present invention, methods and systems for continuous optimization of computing resource allocation are hereinafter described.

Figure 1:
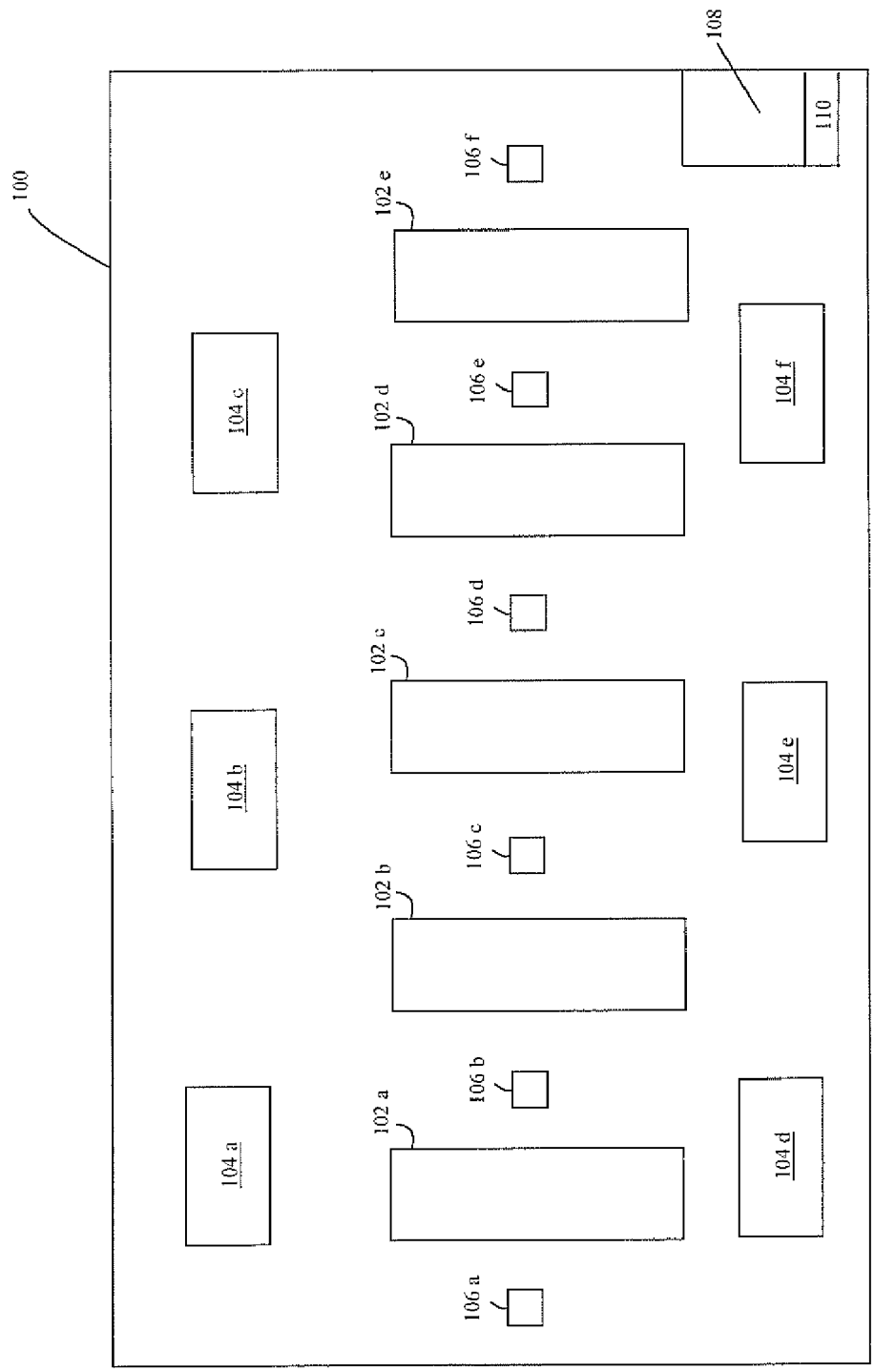
FIG. 1 schematically represents a data center.

With reference to FIG. 1, a representative data center 100 includes at least a plurality of racks 102a-e, typically arranged as shown to create aisles between the racks 102. Also provided are a plurality of cooling units 104a-f, such as for example one or more air conditioning units, chillers, fans, and the like, or alternatively one or more ducts transporting cooled air to desired locations in the data center 100 from a single cooling unit 104. Temperature sensors 106a-f are provided, for measuring a temperature in an interior of or on a surface of components arrayed in racks 102, for measuring an ambient temperature in a vicinity of racks 102, and the like. Still further, a control system 108 may be included, configured for controlling the operations in the data center 100, for receiving data relating to such operations, for communicating information to additional computers or to different data centers 100, and the like. The control unit 108 may be a computer system of substantially conventional design as is known in the art for controlling operations in a data center 100. In one embodiment, the control unit 108 includes a data orchestrator function 110 for provisioning/de-provisioning computing resources according to policies discussed in detail below.

Of course, it is understood that the number and arrangement of racks 102, cooling units 104, and temperature sensors 106 depicted is for example only, as more or fewer such elements may be included and differently arranged according to the size of the particular data center 100. For example, additional temperature sensors 106 (not shown) may be arrayed closer to racks 102, such as on an exterior or interior surface of racks 102, on an interior or exterior surface of one or more components (not shown for convenience) housed in racks 102, and the like. As an example, it is already known in the art to provide "onboard" temperature sensors 106 in servers, which may be incorporated into the present process and systems. It is further understood that the term "data center 100" simply denotes a space housing a variety of computing and other devices, without otherwise imposing any limitations.

The racks 102, which as an example may be electronics cabinets of known design, are intended to hold a plurality of components (not depicted individually for clarity of the drawing) such as computers, servers, monitors, hard drives, disk drives, tape drives, user interfaces such as keyboards and/or a mouse, and the like, intended to perform a variety of computing tasks. For example, the data center 100 may house a plurality of servers, such as grid or blade servers. Brand examples include, but are not limited to, a Windows brand Server, a SUSE Linux Enterprise Server, a Red Hat Advanced Server, a Solaris server or an AIX server.

As is well known in the art, during use of such components, significant heat is generated. Often, in a typical data center, localized areas of thermal stress or "hot spots" may develop, which may be beyond the capacity of the cooling units 104 to remedy. As a non-limiting example, a particular server or array of servers on rack 102a may be provisioned with workloads, while the servers on racks 102b-e remain substantially idle and may not even be powered on. Thus, an area of excessive heat may be generated in the vicinity of rack 102a, creating thermal stress in that area which may exceed the capacity of the nearest cooling units 104a and 104d to remedy. Over time, such thermal stress may damage or reduce the useful lifespan of the components housed in rack 102a.

In computer systems and computer system environments, it is known to provide computing workloads defined by virtual machines. Such virtual machines are known to the skilled artisan to be software implementations of computing devices, which are capable of executing applications in the same fashion as a physical computing device. As examples, system virtual machines provide complete system platforms supporting execution of complete operating systems. Process virtual machines are intended to perform a single application or program, i.e., support a single process. In essence, virtual machines emulate the underlying hardware or software in a virtual environment. Virtual machines also share physical resources, and typically include a hypervisor or other manager which coordinates scheduling control, conflict resolution (such as between applications requesting computing resources), and the like.

Many process, system, and operating system-level virtual machines are known to the skilled artisan. Virtualization is widely used in data centers, and more and more tasks are accomplished by virtualized entities (virtual machines). Due to the relative simplicity of provisioning/de-provisioning virtual machines (in one embodiment broadly termed "live migration"), as will be described below, it is possible to advantageously use this feature of virtual machines in the present method for reducing thermal stress in a data center.

Figure 2:
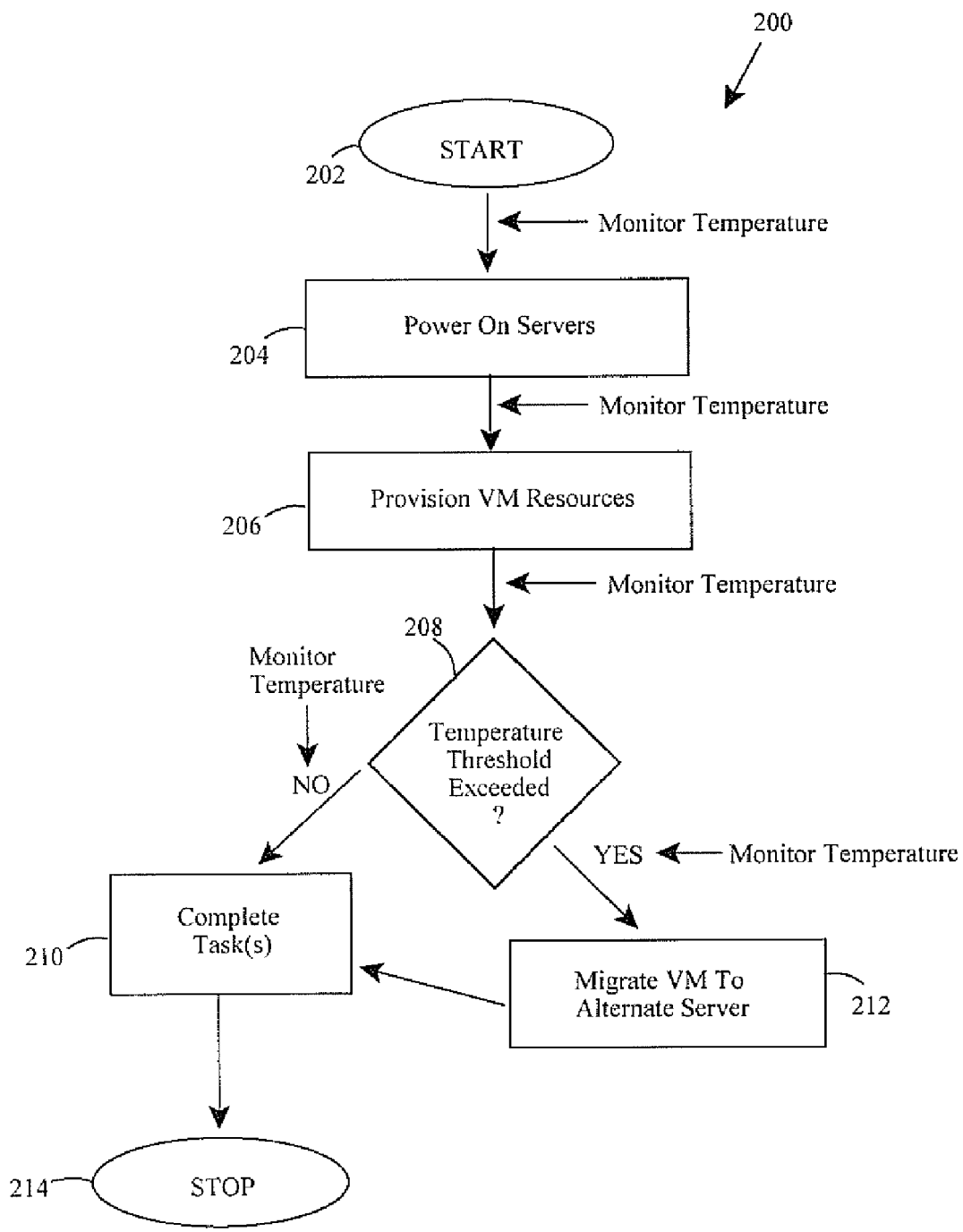
FIG. 2 is a flow chart depicting a method for reducing thermal stress in a data center according to the present invention.
Figure 3:
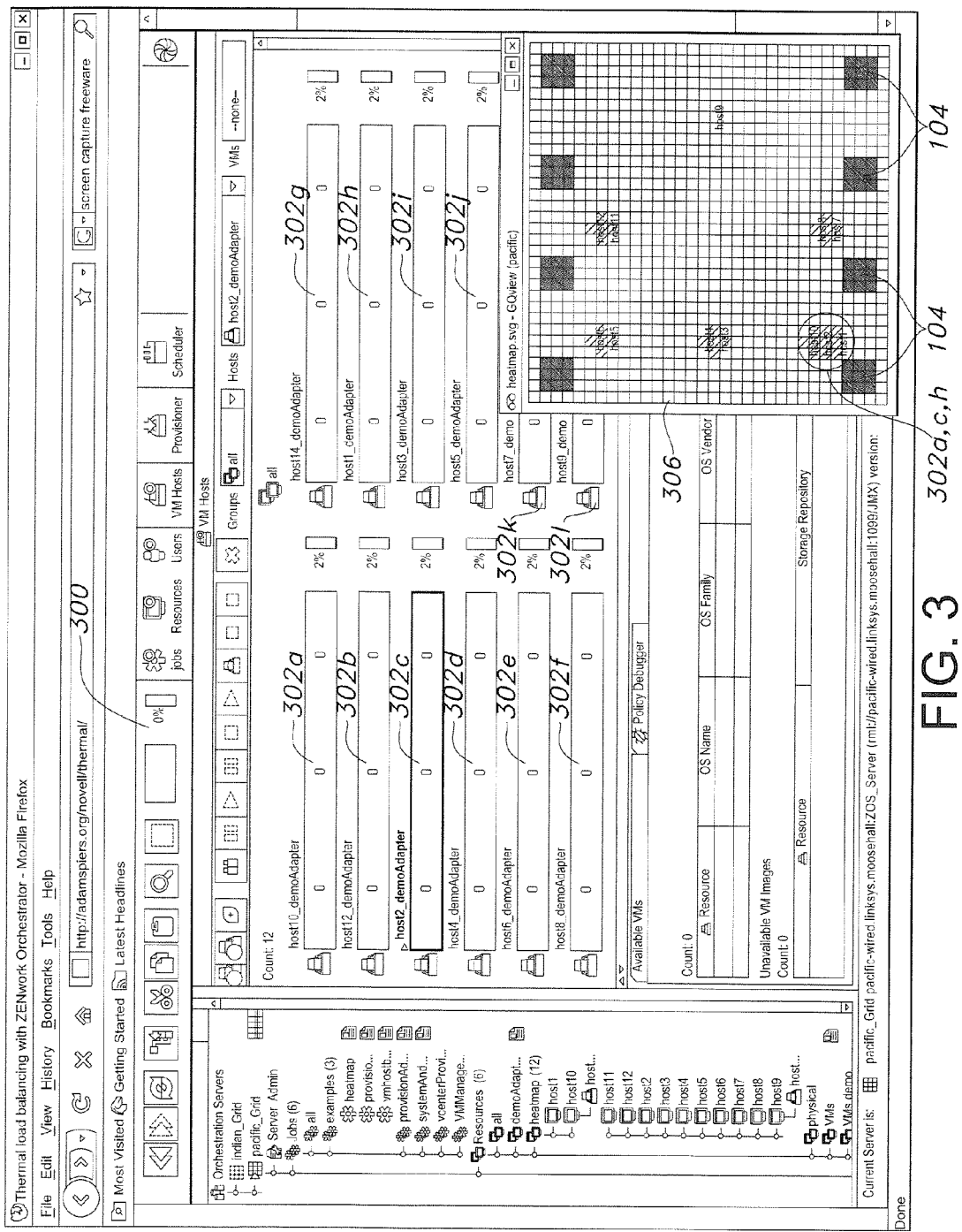
FIG. 3 shows a thermal profile for a representative data center prior to powering on the servers.

Turning to FIG. 2, the overall flow of a process for improving thermal efficiency in one or more data centers 100 as described herein is given generically as 200. At start 202 (the beginning of a particular instance of a recurring time slot), one or more servers are powered on (step 204). In accordance with the allotted computing task or tasks, those servers are provisioned with one or more computing workloads defined as virtual machines (VM, step 206).

A temperature at, in, on, or near the racks 102 may be monitored at each of the above steps, such as by temperature sensors 106. Such temperature data is sent to the control system 108 by any suitable wired or wireless method. Typically, it would not be expected for excessive temperatures to be detected until one or more VM resources had been provisioned, except perhaps in the event of catastrophic equipment failure. After such VM resources have been provisioned, at step 208 the control system 108 determines whether a predetermined temperature threshold has been exceeded. If the answer is no, the task or tasks are completed (step 210), and the process stops (step 214). If the answer is yes, the control system 108 then deprovisions sufficient of the VM resources to reduce thermal stress to less than or equal to the predetermined temperature threshold and migrates those VM resources to one or more alternate servers (step 212). The steps of de-provisioning/re-provisioning VM resources would continue until thermal conditions in the data center 100 and servers housed therein had been determined to have returned to acceptable levels. In this manner, a simple, efficient, and inexpensive method for improving thermal efficiency at a data center 100 is provided.

This process is demonstrated in greater detail in FIGS. 3-7, showing a representative architecture 300 for a data orchestrator 110 according to the present description. For convenience, common reference numerals will be used for each of FIGS. 3-7. Of course, the specific number of components depicted in the Figures is for example only, as it can readily be appreciated that significantly more or significantly fewer such components may be included as desired, in accordance with the size and capacity of the data center 100 housing the components, with the capacity of the components, with the workload imposed on the components, etc.

Figure 4:
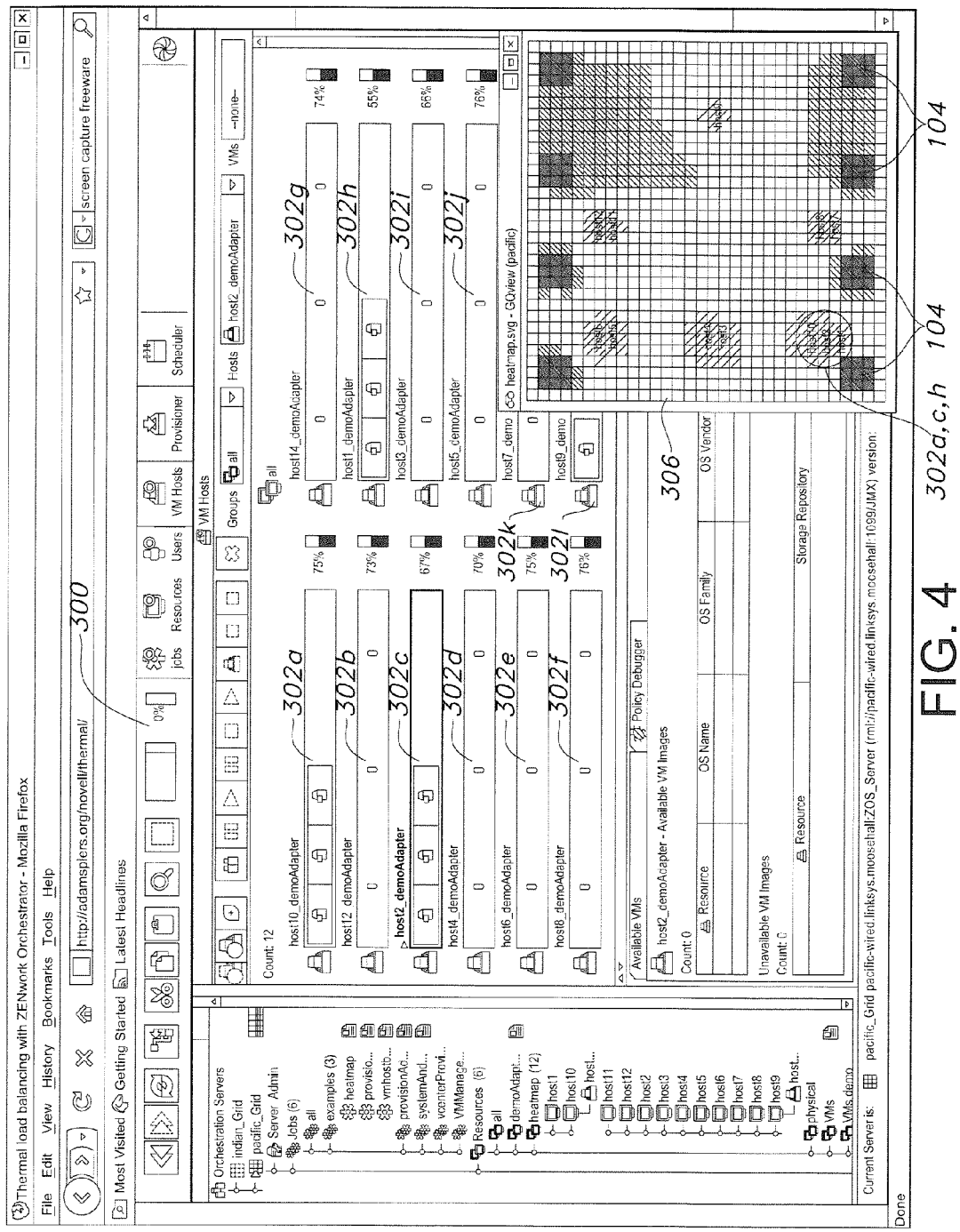
Figure 5:
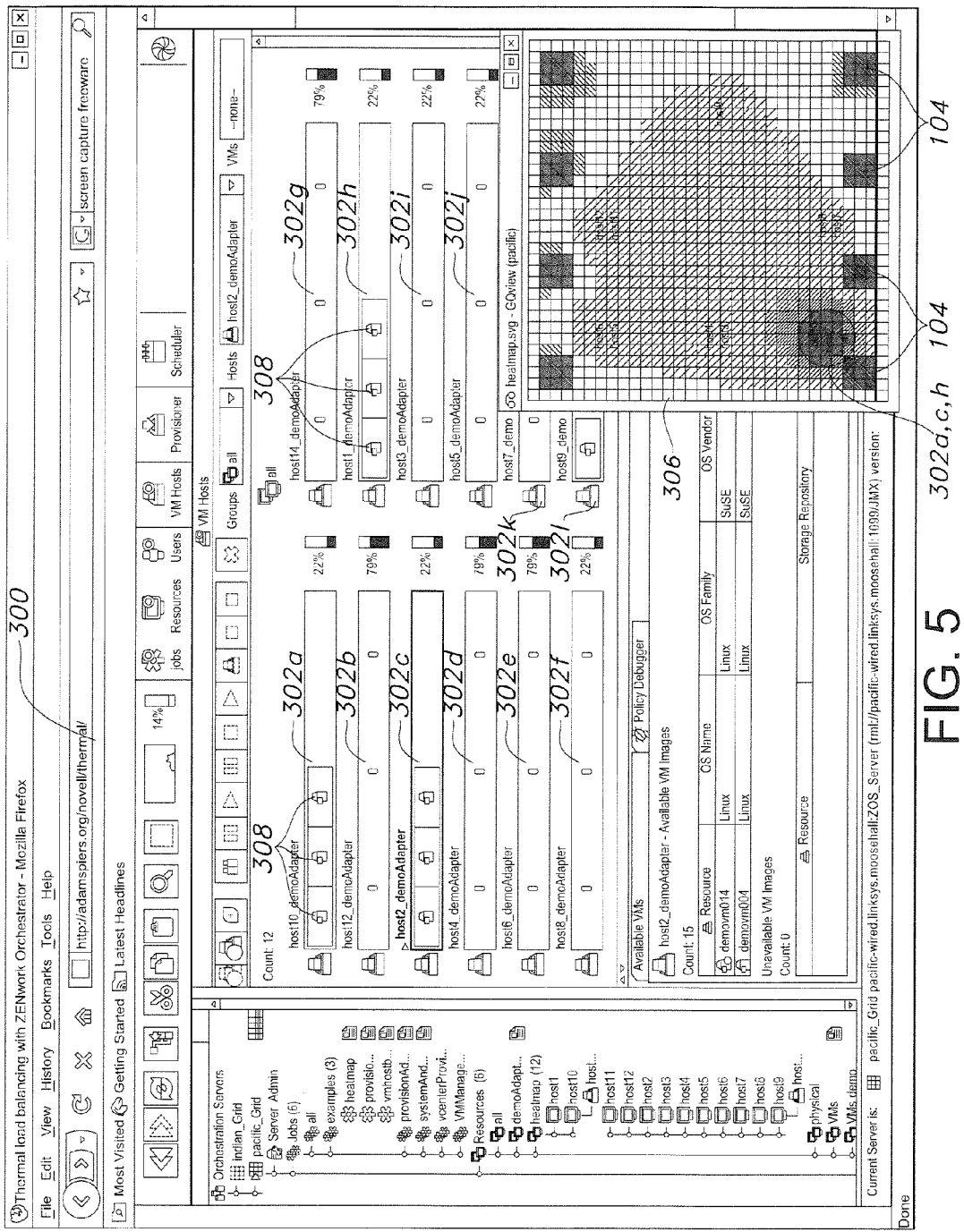
FIG. 5 shows a thermal profile for the data center as depicted in FIG. 4, wherein several of the servers have been provisioned with computing workloads (virtual machines) and an area of thermal stress has been created by over-provisioning of computing workloads.

A plurality of servers 302a-l are shown, each capable of being provisioned with up to three virtual machines 304 (see FIG. 5). Inset is a heat map function 306, showing heat generated at each server 302. It will be appreciated that the displays depicted in FIGS. 3-7 can be modified to depict the information displayed in different, potentially more illustrative or user-friendly ways. For example, the display of heat map function 306 could be altered to show different temperatures or temperature ranges in a series of colors, such as blue for a first temperature range, green for a second, higher temperature range, yellow for a third temperature range which, while acceptable, indicates that the temperature is approaching an undesirable level, and red for a fourth temperature range indicative of excessive thermal stress.

In the depicted embodiment, servers 302 a, c, and h occupy adjoining positions on a rack 102 (racks not shown in FIGS. 3-7 for convenience). For example, servers 302 a, c, and h may be blade servers inserted in adjoining slots. Cooling units 104a-h are depicted on heat map 306. Prior to powering on one or more servers 302a-l, it can be seen that the thermal profile as shown in heat map 306 is acceptable. In FIG. 4, servers 302a-l have been powered on. Heat map 306 shows heat being generated by servers 302a-l, although the thermal profile remains acceptable.

In FIG. 5, servers 302 b, e, g, i, j, k, l have been provisioned with virtual machines 308. In particular, servers 302a, c, and h are provisioned with three virtual machines 308 each. Because servers 302a, c, and h occupy adjoining positions in a rack 102, an area of excessive thermal stress or a "hot spot" has developed as depicted in heat map 306.

Figure 6:
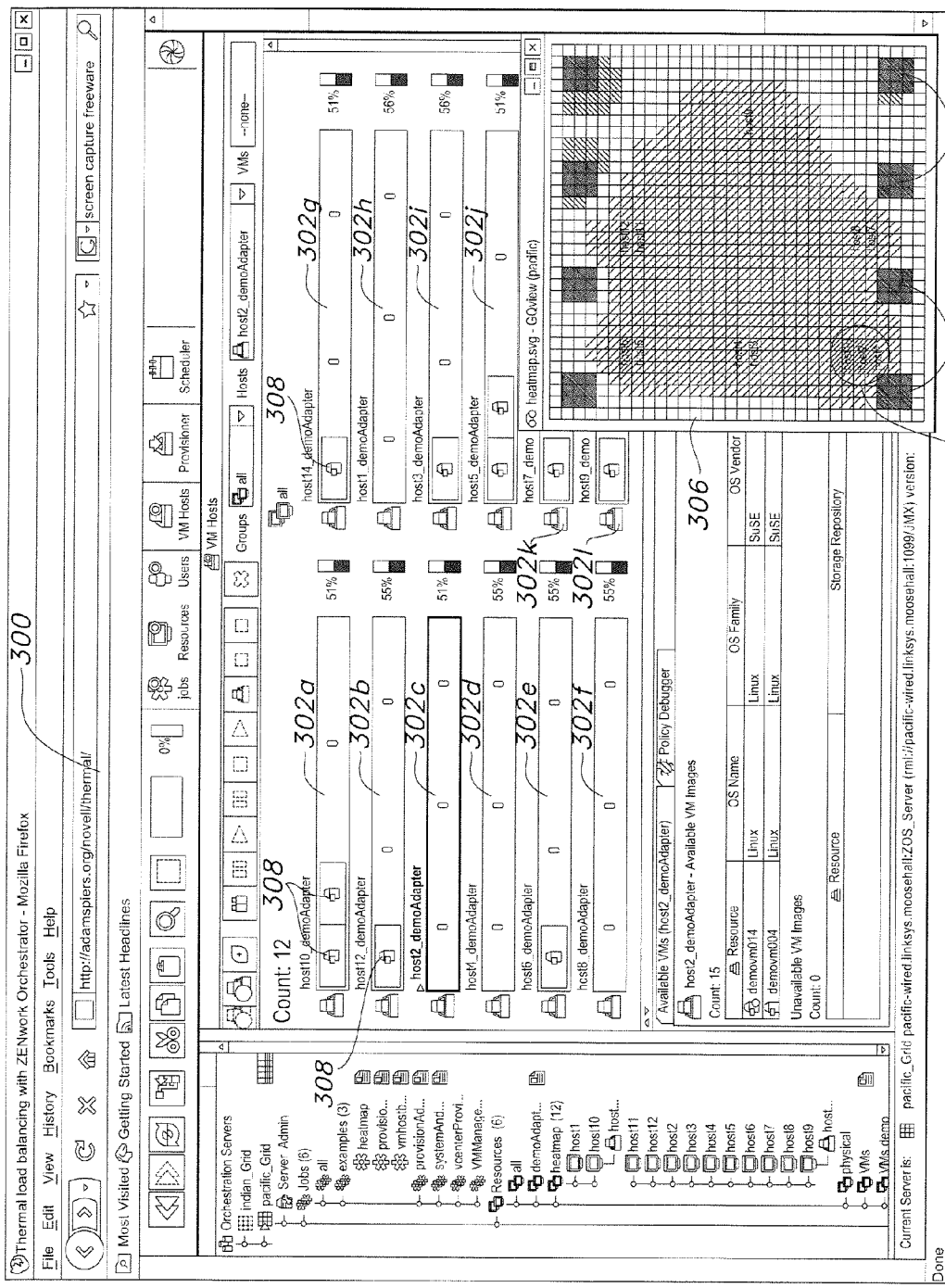
FIG. 6 shows a thermal profile for the data center as depicted in FIG. 5, denoting reduction in thermal stress caused by migration of sufficient computing workloads to alternative servers to reduce the heat accumulation to acceptable levels.

In FIG. 6, data orchestrator 110 has received data from temperature sensors 106 arrayed near servers 302a, c, and h, and determined that the temperature near servers 302a, c, and h exceeds a predetermined temperature threshold (step 208 in FIG. 2; the predetermined temperature threshold will be discussed in greater detail below). Accordingly, data orchestrator 110 deprovisions a suitable number of virtual machines from 302a, c, and h, migrating those resources to servers 302*b, e, f, g, i, j*, and *k*. As is shown in heat map 306, the thermal profile for data center 100 has returned to acceptable levels as a result of this distribution of the virtual machines 308, accomplished response to actual temperature measurement at or near the servers 302 hosting those virtual machines 308.

It is contemplated to provide the data orchestrator 110 as computer executable instructions, e.g., software, as part of computer program products on readable media, e.g., disk for insertion in a drive of a computing device. The computer executable instructions may be made available for installation as a download or may reside in hardware, firmware or combinations in the computing device. When described in the context of computer program products, it is denoted that items thereof, such as modules, routines, programs, objects, components, data structures, etc., perform particular tasks or implement particular abstract data types within various structures of the computing system which cause a certain function or group of functions.

In form, the data orchestrator 110 computer product can be a download of executable instructions resident with a downstream computing device, or readable media, received from an upstream computing device or readable media, a download of executable instructions resident on an upstream computing device, or readable media, awaiting transfer to a downstream computing device or readable media, or any available media, such as RAM, ROM, EEPROM, CD-ROM, DVD, or other optical disk storage devices, magnetic disk storage devices, floppy disks, or any other physical medium which can be used to store the items thereof and which can be assessed in the environment.

Typically, the data orchestrator 110 will be configured at least for receiving data reflecting a measured temperature at or near racks 102, for determining whether the measured temperature exceeds a predetermined temperature threshold, and for migrating sufficient virtual machines 308 to alternate servers 302 to reduce the measured temperature to less than or equal to that predetermined temperature threshold. A database component may be included, either as a part of or separate from data orchestrator 110, for storing the predetermined temperature threshold and other information relevant to determining whether a measured temperature in the data center 100 exceeds that predetermined temperature threshold.

In particular, the data orchestrator 110 may include or define policies determining the parameters under which one or more virtual machines 308 may be migrated to and from one or more servers 302. This feature relates to the calculation of the predetermined temperature threshold as discussed above. As will be appreciated, the temperature and other parameters dictating whether one or more virtual machines can or should be migrated in response to creation of a "hot spot" will vary in accordance with specific features of a data center 100, including individual size and cooling capacity of the data center 100, operating parameters such as number of servers 302 housed therein and their capacity for hosting virtual machines 308, specific parameters of heat generated by the servers 302 in accordance with their manufacture, and even parameters of heat, humidity, etc. according to the geographical location of the data center 100.

Determination of the predetermined temperature threshold may be as simple as a policy for data orchestrator 110 dictating that if a measured temperature at or near a server 302 exceeds a specific temperature during hosting of one or more virtual machines 308, sufficient of the virtual machines 308 must be migrated to one or more alternate servers 302 until the measured temperature at or near the server 302 is reduced to less than or equal to the predetermined temperature maximum. For example, for a particular data center 100 according to its location, capacity, etc., it may be determined that a temperature of 25° C. represents a "hot spot" to be remedied according to the present disclosure.

On the other hand, a more complex policy for data orchestrator 110 may be required to reduce or prevent unnecessary migration of resources, and by that unnecessary migration wasting of computing resources during such migration. In the example given in FIGS. 3-6, wherein servers 302 *a, c*, and *h* occupy adjoining areas in a rack, an operating temperature of greater than 25° C. for any one of those servers may be acceptable for a particular data center 100, because the cooling capacity provided by cooling units 104 can accommodate and remedy it. Thus, in an embodiment of the present invention (see FIG. 7), a policy may be established whereby the predetermined temperature threshold which triggers migration (de-provisioning/re-provisioning of virtual machine resources to alternate servers 302) is tied to additional operating parameters. Of course, the skilled artisan can readily envision additional policies incorporating a variety of parameters considered of importance in accordance with the particular needs of the data center 100 of interest.

Figure 7:
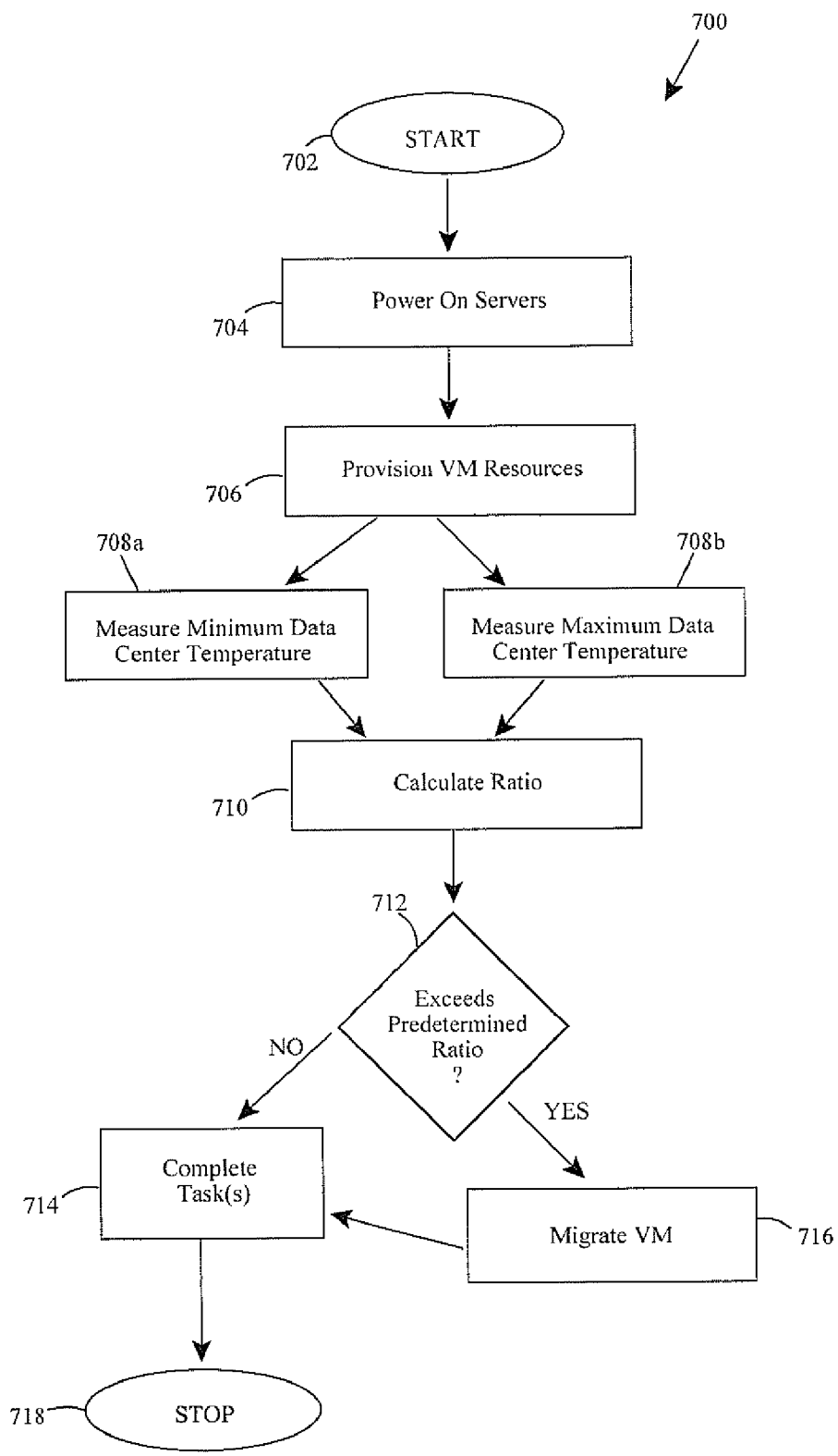
FIG. 7 is a flow chart depicting a method for reducing thermal stress in a data center according to an alternate embodiment of the present invention.

With reference to FIG. 7, the overall flow of an alternative embodiment for a process for improving thermal efficiency in one or more data centers 100 as described herein is given generically as 700. Steps 702-706 are substantially identical to steps 202-206 as described in FIG. 2.

At steps 708*a,b*, a maximum measured temperature and a minimum measured temperature are determined for the data center 100 and then data orchestrator 110 calculates a ratio of the minimum and maximum measured temperatures (step 710). This can be accomplished, for example, by temperature sensors 106 positioned appropriately within the data center 100. That calculated maximum:minimum temperature ratio can be compared by data orchestrator 110 to a predetermined maximum:minimum temperature ratio stored in a database integral to or separate from data orchestrator 110. It will be appreciated that individual data centers 100 will be able to determine what constitutes an appropriate maximum:minimum temperature ratio, based on individual parameters for the data center 100 as discussed above. If the predetermined maximum:minimum temperature ratio is not exceeded, the task or tasks are completed (step 714) and the process stops (step 718). If the predetermined maximum:minimum temperature ratio is exceeded (step 712), data orchestrator 110 may migrate sufficient virtual machines 308 to bring the calculated maximum:minimum temperature ratio back to less than or equal to the predetermined maximum:minimum temperature ratio (step 716).

Figure 8:
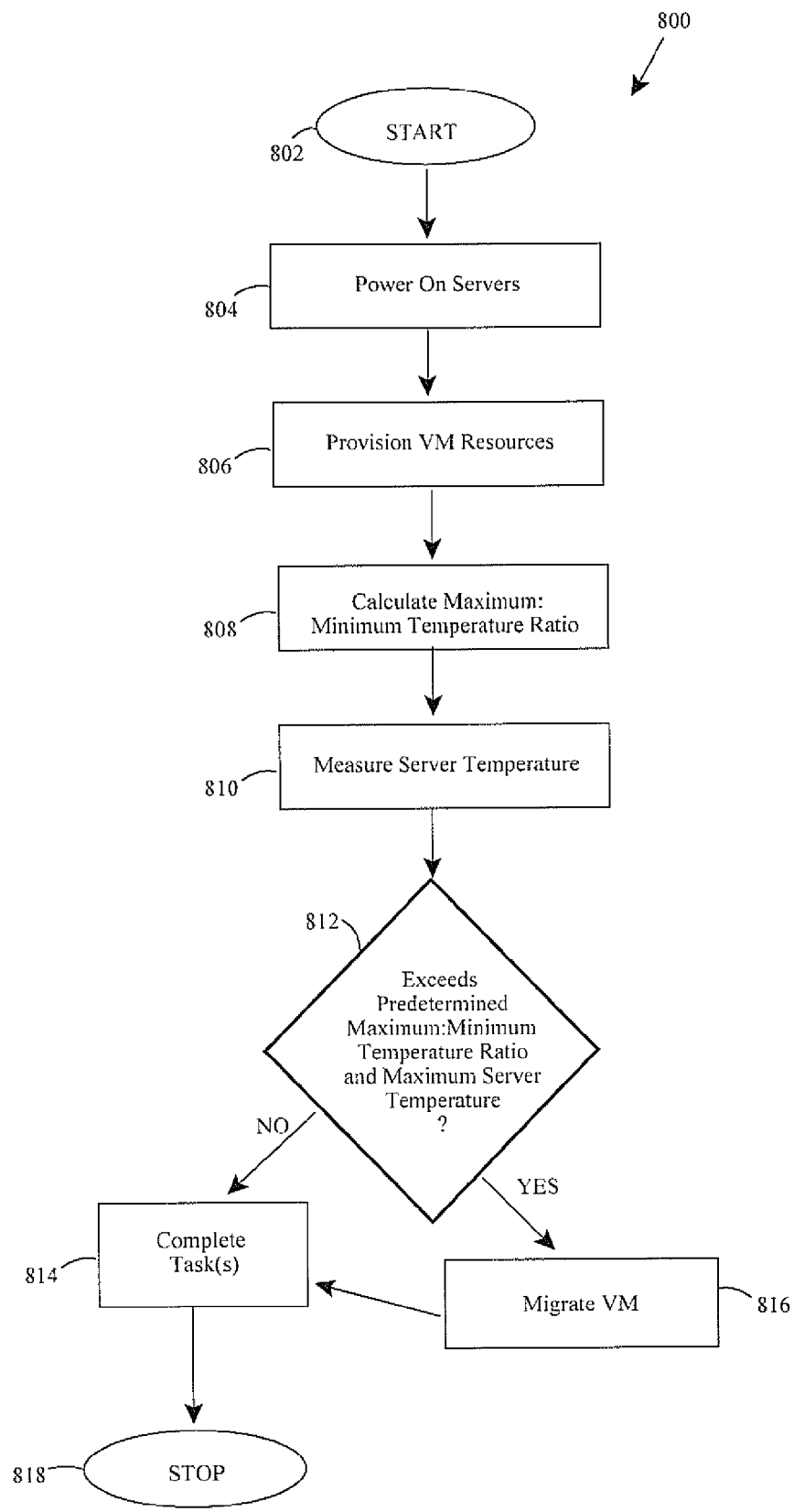
FIG. 8 is a flow chart depicting a method for reducing thermal stress in a data center according to yet another embodiment of the present invention.

Still other operating parameters may be factored into the data orchestrator 110 policy determining when to migrate virtual machines 308, to further optimize the process. This is depicted in flow chart fashion in FIG. 8, wherein yet another embodiment for a process for improving thermal efficiency is given generically as 800. Steps 802 to 806 are substantially identical to steps 202-206 as described in FIG. 2. As described above and depicted in FIGS. 1-2, a temperature at, in, on, or near the racks 102 may be monitored at each of the above steps, such as by temperature sensors 106. Such temperature data is sent to the control system 108 containing data orchestrator 110 by any suitable wired or wireless method.

After virtual machine 308 resources have been provisioned to one or more servers 302 (step 806), data orchestrator 110 calculates the maximum:minimum temperature ratio for data center 100 as described above (step 808 of FIG. 8). Data orchestrator 110 also receives data relating to temperature at or near the servers 302 housed in data center 100 (step 810).

For example, data orchestrator 110 may receive data defining a measured operating temperature of a particular server 302, provided by an onboard temperature sensor 106, which shows the operating temperature of that server 302. Alternatively, data orchestrator 110 may receive data from a temperature sensor 106 positioned in a vicinity of a server 302, reflecting the ambient temperature in the vicinity of that server 302. Still further, both operating and ambient temperature data may be incorporated into the policy. If both the predetermined maximum:minimum temperature ratio for the data center 100 and the predetermined maximum server temperature are determined to have been exceeded (step 812), data orchestrator 110 then migrates sufficient virtual machine 308 resources to alternate servers 302 to bring the temperature parameters back to acceptable levels (step 816). If both the predetermined maximum:minimum temperature ratio for the data center 100 and the predetermined maximum server temperature are not exceeded, then the task or tasks are completed (step 814) and the process is stopped (step 818)

Still further, the policy or policies defining when data orchestrator 110 will migrate virtual machine 308 resources to eliminate "hot spots" may take into consideration additional factors, such as one or more of a measured temperature at one or more alternate servers 302 which are candidates to receive the migrated virtual machine 308 resources and a capacity of the candidate alternate servers 302 to accept the migrated virtual machine 308 resources. As a non-limiting example, in FIGS. 3-7 are depicted servers 302 capable of hosting up to three virtual machines 308. Thus, data orchestrator 110 would not consider servers already hosting three virtual machines 308 as candidates for migration of additional virtual machines thereto. Even further, data orchestrator 110 may include a predictive function, allowing a determination of the prospective thermal effect of migrating one or more virtual machine resources 308 to a particular server 302 prior to such migration.

Certain advantages of the invention over the prior art should now be readily apparent. The skilled artisan will readily appreciate that by the present disclosure is provided a simple, efficient, and economical process, and computer systems and computer executable instructions for accomplishing the process, for improving thermal efficiency of one or more data centers. Rather than requiring alteration of cooling and/or heat dissipation capacity in the data center or physically powering down computing resources to reduce thermal stress, de-provisioning/re-provisioning of computing resources defined by virtual machines provides a reduction of thermal stress in a simple, robust, and effective manner, and further allows addressing undesirable alterations in a thermal profile of a data center 100 in real- or near-real time Still further, it will be appreciated that the process and systems as described above find application in improving thermal efficiency of individual data centers 100, but also in improving thermal efficiency of a plurality of data centers 100. It is known to provide data centers at a variety of geographic locations, which may function independently, but which also may be required to function cooperatively. A plurality of data centers 100 may indeed be part of a network or grid for a particular entity. The skilled artisan will readily appreciate that the present process and systems are applicable to grids of resources represented by a plurality of data centers 100 separated geographically but interconnected, such as in network, with the proviso that the grid of data centers should share a storage grid.

Finally, one of ordinary skill in the art will recognize that additional embodiments are also possible without departing from the teachings of the present invention. This detailed description, and particularly the specific details of the exemplary embodiments disclosed herein, is given primarily for clarity of understanding, and no unnecessary limitations are to be implied, for modifications will become obvious to those skilled in the art upon reading this disclosure and may be made without departing from the spirit or scope of the invention. Relatively apparent modifications, of course, include combining the various features of one or more figures with the features of one or more of other figures.

The invention claimed is:

1. A method for improving thermal efficiency in one or more data centers housing a plurality of computing devices, comprising:
   measuring a temperature at one or more of the plurality of computing devices having allocated thereto one or more computing workloads;
   determining whether said measured temperature exceeds a predetermined temperature threshold, said predetermined temperature threshold being set by measuring a maximum temperature and a minimum temperature at the one or more data centers, calculating a ratio between said measured maximum and minimum temperatures, determining whether that calculated temperature ratio falls within a predetermined range of temperature ratios, and if so, determining whether the measured temperature at the one or more of the plurality of computing devices exceeds a predetermined temperature maximum; and
   if the measured temperature exceeds the predetermined temperature threshold, migrating a sufficient number of the one or more computing workloads to one or more alternate computing devices to reduce said temperature at one or more of the plurality of computing devices to less than or equal to said predetermined temperature threshold.

2. The method of claim 1, including the step of providing a data orchestrator configured at least for:
   receiving data concerning said measured temperature;
   determining whether said measured temperature exceeds said predetermined temperature threshold; and
   migrating sufficient of the one or more computing workloads to one or more alternate computing devices.

3. The method of claim 2, further including providing at least one temperature sensor for measuring a maximum temperature and a minimum temperature at the one or more data centers.

4. The method of claim 2, wherein the data orchestrator is configured to migrate sufficient of the one or more computing workloads to one or more alternate computing devices according to at least one of:
   a measured temperature at the one or more alternate computing devices; and
   a capacity of the one or more alternate computing devices to perform the computing workload migrated thereto.

5. The method of claim 1, wherein the step of measuring a temperature comprises placing at least one temperature sensor for at least one of measuring a temperature in an interior of one or more of the computing devices, measuring a temperature at a surface of one or more of the computing devices, or measuring an ambient temperature in a vicinity of one or more of the computing devices.

6. In a computing system environment, a method for improving thermal efficiency in one or more data centers housing a plurality of computing devices, comprising:
   providing in said one or more data centers a plurality of computing devices hosting a pool of computing workloads defined by virtual machines;

providing a plurality of sensors for measuring a temperature at one or more of the plurality of computing devices; and providing a data orchestrator configured at least for receiving data concerning a measured temperature at one or more of the plurality of computing devices, for determining whether said measured temperature exceeds a predetermined temperature threshold, and for migrating sufficient of the one or more computing workloads to one or more alternative computing devices to reduce said measured temperature to less than or equal to said predetermined temperature threshold;

wherein the step of determining by the data orchestrator whether the predetermined temperature threshold is exceeded is accomplished by calculating a temperature ratio between a measured maximum temperature and a measured minimum temperature at the one or more data centers, determining whether the temperature ratio falls within a predetermined range of temperature ratios, and if so, determining whether the measured temperature at the one or more of the plurality of computing devices exceeds a predetermined temperature maximum.

7. The method of claim 6, further including providing at least one temperature sensor for measuring the maximum temperature and the minimum temperature at the one or more data centers.

8. The method of claim 6, wherein the data orchestrator is configured to migrate sufficient of the one or more computing workloads to one or more alternate computing devices according to at least one of:

a measured temperature at the one or more alternate computing devices; and a capacity of the one or more alternate computing devices to perform the computing workload migrated thereto.

9. The method of claim 6, wherein the step of measuring a temperature comprises placing at least one temperature sensor for at least one of measuring a temperature in an interior of one or more of the computing devices, measuring a temperature at a surface of one or more of the computing devices, or measuring an ambient temperature in a vicinity of one or more of the computing devices.

10. A computing system for improving thermal efficiency in one or more data centers housing a plurality of computing devices, comprising:

a plurality of servers hosting a pool of computing workloads defined by virtual machines;

a plurality of sensors for measuring a temperature at one or more of the plurality of computing devices; and a data orchestrator configured at least for receiving data concerning a measured temperature at one or more of the plurality of servers, for determining whether said measured temperature exceeds a predetermined temperature threshold, and for migrating sufficient of the one or more computing workloads to one or more alternative servers to reduce said measured temperature to less than or equal to said predetermined temperature threshold;

wherein the determining is accomplished by measuring a maximum temperature and a minimum temperature at the one or more data centers, calculating a ratio between said measured maximum and minimum temperatures, determining whether that ratio falls within a predetermined range of ratios, and if so, determining whether the measured temperature at the one or more of the plurality of servers exceeds a predetermined temperature maximum.

11. The system of claim 10, further wherein the data orchestrator is configured for receiving data defining a measured maximum temperature and a measured minimum temperature at the one or more data centers.

12. The system of claim 11, further wherein the data orchestrator is configured for migrating the one or more computing workloads to one or more alternate servers according to at least one of:

a measured temperature at the one or more alternate servers; and a capacity of the one or more alternate servers to perform the computing workload migrated thereto.

13. The system of claim 10, further including a plurality of temperature sensors arrayed in the one or more data centers for at least one of measuring a temperature in an interior of one or more of the servers, measuring a temperature at a surface of one or more of the servers, or measuring a temperature in a vicinity of one or more of the servers.

14. A computer program product available as a download or on a computer-readable medium for installation with a computing device of a user, said computer program product comprising:

a database component for storing a predetermined temperature threshold for a plurality of servers, a predetermined temperature ratio range for one or more data centers housing the plurality of servers, and a predetermined temperature maximum for the plurality of servers; and a data orchestrator component for migrating sufficient of a plurality of computing workloads to one or more alternate servers to reduce said temperature at one or more of the plurality of servers to less than or equal to the predetermined temperature threshold;

wherein the data orchestrator component defines a computing workload migrating policy for migrating one or more of said plurality of computing workloads, said policy allowing workload migration if the following conditions are met:

a) the predetermined temperature threshold is exceeded; and b) a capacity of the one or more alternate servers will allow the selected alternate server to perform the computing workload migrated thereto;

further wherein the data orchestrator is configured to determine whether the predetermined temperature threshold is exceeded at one or more of the plurality of servers by: 1) calculating a temperature ratio between of a measured minimum temperature and a measured maximum temperature for said one or more data centers, 2) determining whether the calculated temperature ratio falls within the predetermined temperature ratio range, and 3) determining whether a temperature at one or more of the plurality of servers exceeds a predetermined temperature maximum.

15. The computer program product of claim 14, wherein one or more of the plurality of computing workloads are defined as virtual machines.

* * * * *